(12) United States Patent
Iwagami et al.

(10) Patent No.: US 6,653,864 B2
(45) Date of Patent: Nov. 25, 2003

(54) INTERFACE

(75) Inventors: Tooru Iwagami, Tokyo (JP); Hiroshi Sakata, Tokyo (JP); Shinya Shirakawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 18 days.

(21) Appl. No.: 10/120,373

(22) Filed: Apr. 12, 2002

(65) Prior Publication Data

US 2002/0180481 A1 Dec. 5, 2002

(30) Foreign Application Priority Data

Jun. 5, 2001 (JP) ........................................ 2001-169696

(51) Int. Cl.$^7$ .......................................... H03K 19/0175
(52) U.S. Cl. ............................ 326/82; 326/63; 327/205
(58) Field of Search ............................ 326/63, 80, 82, 326/83, 86; 327/205; 340/648

(56) References Cited

U.S. PATENT DOCUMENTS 4,390,871 A * 6/1983 Andrews .................... 340/659

* cited by examiner

*Primary Examiner*—Daniel Chang
(74) *Attorney, Agent, or Firm*—Oblon, Spivak, McClelland, Maier & Neustadt, P.C.

(57) ABSTRACT

In an interface between a high-active driving circuit for driving a predetermined semiconductor power element and a microcomputer for controlling an output signal of the driving circuit, the microcomputer comprises a transistor, a collector terminal of which is an output side of the microcomputer; and the driving circuit comprises a first resistor, one end of which is directly connected with the output side of the microcomputer; a Schmidt circuit which is connected in series with the other end of the first resistor; a diode, an anode side of which is connected to a path between the first resistor and the Schmidt circuit; a power supply voltage connected with a cathode side of the diode; and a second resistor, one end of which is grounded and the other end of which is connected with a side of the first resistor being an input terminal of the driving circuit.

1 Claim, 3 Drawing Sheets

Fig.2A ⎍⎍⎍ $V_{om}$ MICROCOMPUTER OUTPUT
(=$V_{in}$ DRIVING CIRCUIT INPUT)

Fig.2B ⎍⎍⎍ $V_o$ DRIVING CIRCUIT OUTPUT

Fig.3 PRIOR ART
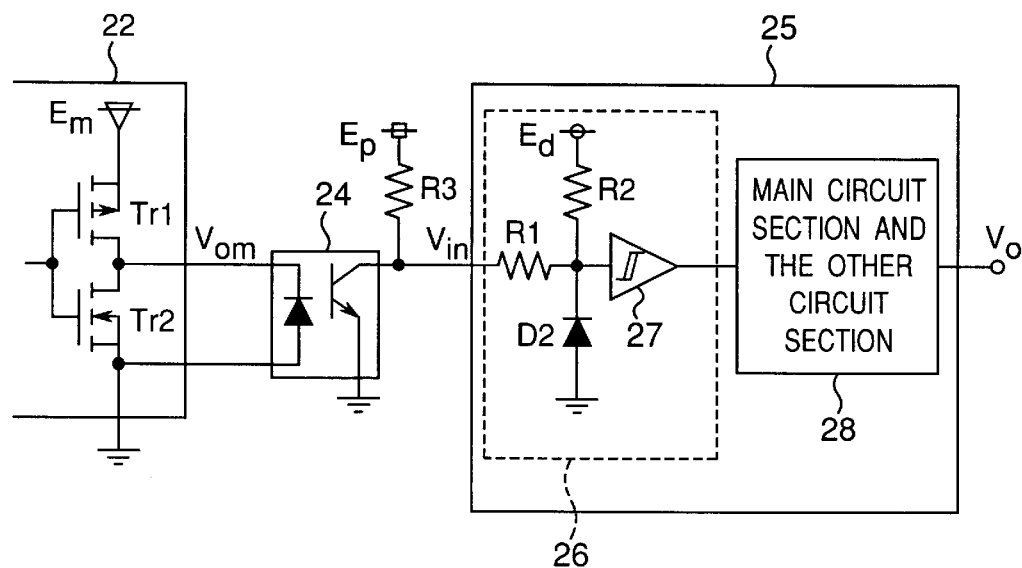
Fig.4A  $V_{om}$ MICROCOMPUTER OUTPUT
Fig.4B  $V_{in}$ DRIVING CIRCUIT INPUT
Fig.4C  $V_o$ DRIVING CIRCUIT OUTPUT
PRIOR ART

INTERFACE

BACKGROUND OF THE INVENTION

The present invention relates to an interface circuit between a microcomputer and a driving circuit for controlling an inverter system by means of a microcomputer.

In recent years, in an inverter system to be used for motor control or the like, for example, control with a microcomputer is generally applied due to a demand for functional improvement. In this technique, a more acceptable interface circuit configuration is required between the microcomputer and a driving circuit.

Conventionally, as shown in FIG. 3, a photo coupler 24 is generally used for insulation between a driving circuit 25 of a semiconductor power element and a control signal output side of a microcomputer 22. As the photo coupler 24, an open collector output type of photo coupler is mostly used, and in this output type, an output signal from the photo coupler 24 is inverted logically with respect to its input signal.

FIGS. 4A through 4C show a square waveform representing an output voltage signal $V_{om}$ of the microcomputer in the conventional interface circuit configuration between the microcomputer and the driving circuit, and a square waveform representing an input voltage signal $V_{in}$ of the driving circuit and a square waveform representing an output voltage signal $V_o$ of the driving circuit. In the interface circuit configuration between the microcomputer and the driving circuit, when the input voltage signal $V_{in}$ of the driving circuit 25 is in a low level, the output voltage signal $V_o$ of the driving signal 25 is brought into a high level so that the output voltage signal $V_{om}$ of the microcomputer 22 and the output voltage signal $V_o$ of the driving circuit 25, namely, an input voltage signal to the semiconductor power element are homeomorphus signals (so-called low-active operation).

Incidentally, in the case where HVIC (high Voltage IC) is applied as the driving circuit of the semiconductor power element, as shown in FIG. 5, the photo coupler is not used and the driving circuit can be directly connected with the microcomputer. In this configuration, one end of a resistor R3 is connected with a line which connects the driving circuit 25 and the microcomputer 22. Moreover, a pull-up power supply voltage $E_p$ is provided on the other end of the resistor R3.

However, in the current situation, also in the case where HVIC is applied as the driving circuit, a configuration using the photo coupler (see FIG. 3) similarly to the conventional technique, or a configuration where, as shown in FIG. 5, the driving circuit 25 is directly connected with the microcomputer 22 and a control signal is inverted to be output on the side of the microcomputer 22 is used. As a result, the low-active system is mostly adopted in the driving circuit 25. In the former configuration, a characteristic of the high-withstand voltage HVIC that the photo computer is not necessary cannot be utilized. On the other hand, in the latter configuration, in the case where the conventional configuration of the low-active system driving circuit is directly adopted, when the pull-up power supply voltage $E_p$ is higher than a power supply voltage $E_m$ of the microcomputer 22, an excess current flows from the pull-up power supply voltage $E_p$ into a collector of the microcomputer 22 via the pull-up resistor R3. As a result, the microcomputer 22 is possibly broken.

The present invention has been developed in view of the above technical drawback and its object to provide an interface having higher reliability between a driving circuit of a semiconductor power element and a microcomputer for controlling output of the driving circuit.

SUMMARY OF THE INVENTION

In an aspect of the invention, there is provided an interface between a high-active system driving circuit for driving a predetermined semiconductor power element and a microcomputer for controlling an output signal of the driving circuit, the interface for directly connecting an output side of the microcomputer and an input side of the driving circuit, characterized in that: the microcomputer comprises a transistor having a collector terminal to be the output side of the microcomputer, and the driving circuit comprises: a first resistor, one end of which is directly connected with the output side of the microcomputer; a Schmidt circuit connected in a series with the other end of the first resistor; a diode, an anode side of which is connected between the first resistor and the Schmidt circuit; a power supply voltage connected with a cathode side of the diode; and a second resistor, one end of which is grounded and the other end of which is connected with a side of the first resistor being an input terminal of the driving circuit.

BRIEF DESCRIPTION OF THE DRAWINGS

FIG. 2A shows a square waveform representing an output voltage signal $V_{om}$ of the microcomputer;

FIG. 2B shows a square waveform representing an output voltage signal $V_o$ of the driving circuit;

FIG. 3 is a diagram showing one example of a conventional interface circuit configuration between a microcomputer and a driving circuit;

FIG. 4A shows a square waveform representing an output voltage signal $V_{om}$ of the microcomputer in the conventional interface circuit configuration between the microcomputer and the driving circuit;

FIG. 4B shows a square waveform representing an input voltage signal $V_{in}$ of the driving circuit in the conventional interface circuit configuration between the microcomputer and the driving circuit;

FIG. 4C shows a square waveform representing an output voltage signal $V_o$ of the driving circuit in the conventional interface circuit configuration between the microcomputer and the driving circuit.

DETAILED DESCRIPTION OF THE PREFERRED EMBODIMENTS

There will be explained below an embodiment of the present invention with reference to the attached drawings.

Figure 1:
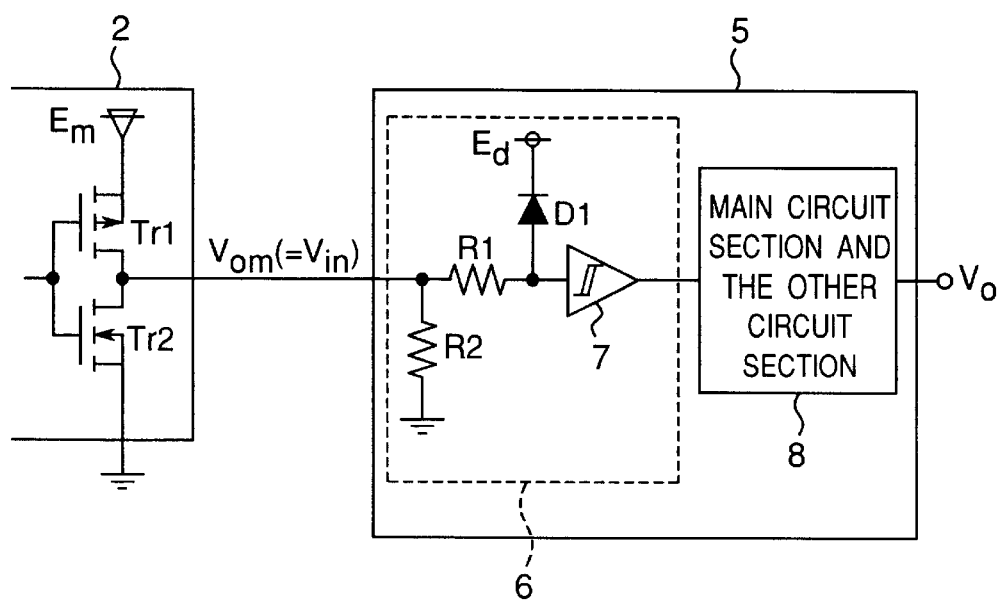
FIG. 1 is a diagram showing an interface circuit configuration between a microcomputer and a driving circuit according to an embodiment of the present invention.
Figure 5:
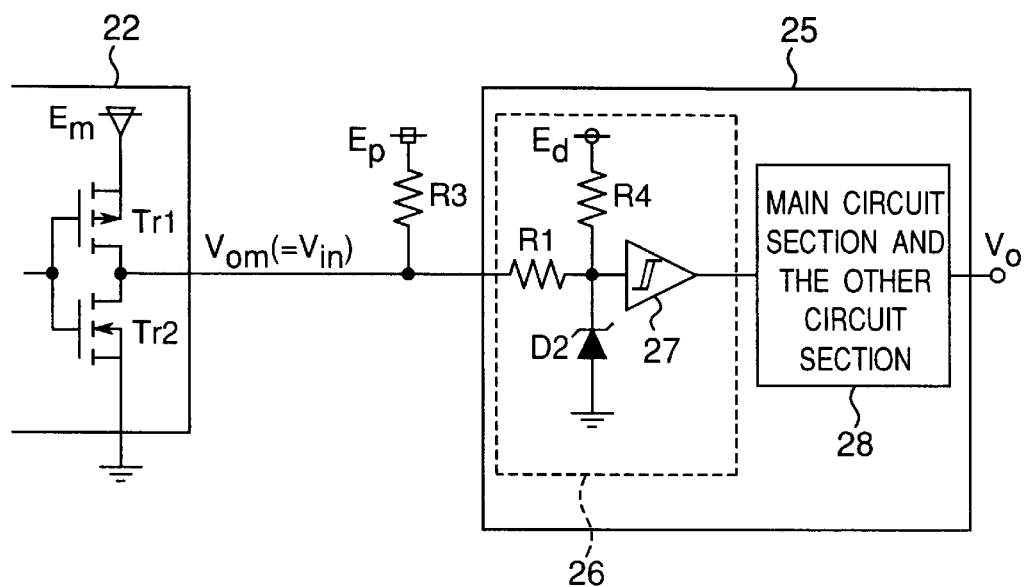
FIG. 5 is a diagram showing another example of the conventional interface circuit configuration between the microcomputer and the driving circuit.

FIG. 1 is a diagram showing an interface circuit configuration between a microcomputer and a driving circuit according to the embodiment of the present invention. The microcomputer 2 and the driving circuit 5 control an inverter system to be used for motor control or the like. An output voltage signal $V_o$ from the driving circuit 5 to a semiconductor power element (not shown) is controlled by an output voltage signal $V_{om}$ from the microcomputer 2. As the driving circuit 5, a high-active system driving circuit in which a logic is effective when an input signal is in a digital high level is adopted.

The microcomputer 2 has transistors Tr1 and Tr2 and a power supply voltage $E_m$. In this embodiment, an emitter terminal of the transistor Tr1 is connected with the power supply voltage $E_m$, and an emitter terminal of the transistor Tr2 is grounded. Moreover, collector terminals of the transistors Tr1 and Tr2 serve as an output terminal of the microcomputer 2.

Meanwhile, the driving circuit 5 has an input circuit section 6 which is composed of a power supply voltage $E_d$, a diode, first and second resistors R1 and R2 and a Schmidt circuit 7, a main circuit section and another circuit section 8 which are provided on a side closer to the output side than the input circuit 6. In the input circuit section 6, an anode side of the diode D1 is connected to a path between the first resistor R1 on the input side and the Schmidt circuit 7 on the output side which are connected in series. A cathode side of the diode D1 is connected with the power supply voltage $E_d$. Moreover, an input side of the first resistor R1 is connected with one end of the second resistor R2. The other end of the second resistor R2 is grounded.

In the present embodiment, an output side of the microcomputer 2 is directly connected with an input side of the driving circuit 5. According to said interface circuit configuration between the microcomputer 2 and the driving circuit 5, since the input side of the driving circuit 5 is grounded at the second resistor R2, an excess current does not flow from the output terminal into the microcomputer 2. Further, in this case, it is not necessary to change the circuit configuration element according to a change in the output signal level of the microcomputer 2.

FIGS. 2A and 2B show square waveforms representing the output voltage signal $V_{om}$ from the microcomputer 2 and the output voltage signal $V_o$ of the driving circuit 5. As is clear from the drawings, according to the interface circuit configuration between the microcomputer 2 and the driving circuit 5, since the output side of the microcomputer 2 is directly connected with the input side of the driving circuit 5, the output voltage signal $V_{om}$ of the microcomputer 2 and the output voltage signal $V_o$ of the driving circuit become homeomorphous signals.

As mentioned above, in the interface circuit configuration between the microcomputer 2 and the driving circuit 5 according to the present embodiment, while the microcomputer 2 can be directly connected with the driving circuit 5 without requiring additive configuration, an excess current can be prevented from flowing into the microcomputer 2. As a result, the interface with higher reliability can be realized therebetween.

The present invention is not limited to the exemplified embodiment, and needless to say, various modifications and alternations in design can be made within the scope of gist of the invention.

As is clear from the above explanation, according to the present invention, since the input side of the driving circuit is ground at the second resistor, an excess current does not flow from the output terminal into the microcomputer. As a result, the interface with higher reliability can be realized between the microcomputer and the driving circuit.

What is claimed is:

1. An interface between a high-active driving circuit for driving a predetermined semiconductor power element and a microcomputer for controlling an output signal of the driving circuit, said interface for directly connecting an output side of the microcomputer and an input side of the driving circuit, wherein:

said microcomputer comprises a transistor having a collector terminal to be the output side of the microcomputer; and said driving circuit comprises:
    a first resistor, one end of which is directly connected with the output side of the microcomputer;
    a Schmidt circuit connected in a series with the other end of the first resistor;
    diode, an anode side of which is connected to a path between the first resistor and the Schmidt circuit;
    a power supply voltage connected with a cathode side of the diode; and
    a second resistor, one end of which is grounded and the other end of which is connected with a side of the first resistor being an input terminal of the driving circuit.

* * * * *